United States Patent [19]

Cota

[11] Patent Number: 5,502,374
[45] Date of Patent: Mar. 26, 1996

[54] CURRENT SENSORS

[75] Inventor: Roger S. Cota, Vancouver, Wash.

[73] Assignee: Veris Industries, Inc., Portland, Oreg.

[21] Appl. No.: 300,732

[22] Filed: Sep. 2, 1994

[51] Int. Cl.$^6$ .................................................. G01R 19/22
[52] U.S. Cl. ........................... 324/127; 324/119; 324/129
[58] Field of Search ..................................... 324/127, 119, 324/129, 149, 111, 142

[56] References Cited

U.S. PATENT DOCUMENTS

| | | | |
|---|---|---|---|
| 1,800,474 | 4/1931 | Scherer | 324/127 |
| 1,871,710 | 8/1932 | Lenehan | 324/119 |
| 2,059,594 | 11/1936 | Massa, Jr. | 324/142 |
| 2,428,613 | 10/1947 | Boyajian | 324/127 |
| 2,802,182 | 8/1957 | Godshalk et al. | 324/127 |
| 3,772,625 | 11/1973 | Raupach . | |
| 4,030,058 | 6/1977 | Riffe et al. . | |
| 4,048,605 | 9/1977 | McCollum . | |
| 4,096,436 | 6/1978 | Cook et al. . | |
| 4,198,595 | 4/1980 | Milkovic . | |
| 4,258,348 | 3/1981 | Belfer et al. . | |
| 4,297,741 | 10/1981 | Howell . | |
| 4,408,175 | 10/1983 | Nelson et al. . | |
| 4,413,230 | 11/1983 | Miller . | |
| 4,491,790 | 1/1985 | Miller . | |
| 4,495,463 | 1/1985 | Milkovic . | |
| 4,783,748 | 11/1988 | Swarztrauber et al. . | |
| 4,794,327 | 12/1988 | Fernandes . | |
| 4,808,910 | 2/1989 | Kessi . | |
| 4,851,803 | 7/1989 | Hahn . | |
| 4,855,671 | 8/1989 | Fernandes . | |
| 4,939,451 | 7/1990 | Baran et al. . | |
| 4,972,167 | 11/1990 | Fujioka . | |
| 5,003,278 | 3/1991 | May . | |
| 5,039,970 | 8/1991 | Cox . | |
| 5,066,904 | 11/1991 | Bullock . | |
| 5,196,784 | 3/1993 | Estes, Jr. . | |
| 5,223,790 | 6/1993 | Baran et al. . | |

*Primary Examiner*—Kenneth A. Wieder
*Assistant Examiner*—Kourosh Cyrus Khosravi
*Attorney, Agent, or Firm*—Chernoff, Vilhauer, McClung & Stenzel

[57] ABSTRACT

A power measuring system includes a transformer that produces a voltage signal in response to the presence of a changing current within a power cable. An input circuit is electrically connected to the transformer for receiving the voltage signal, and produces an analog current signal representative of the changing current within the power cable, in response to receiving the voltage signal. A transmission line has a first end electrically interconnected with the input circuit so as to receive the analog current signal and has a second end electrically interconnected with an output circuit located at a location remote from the first end. The output circuit receives the analog current signal and produces a resultant signal in response to receiving the analog current signal. The resultant signal may be used to provide a meter display. A housing for a sensing transformer having a split toroidal core is disclosed.

16 Claims, 10 Drawing Sheets

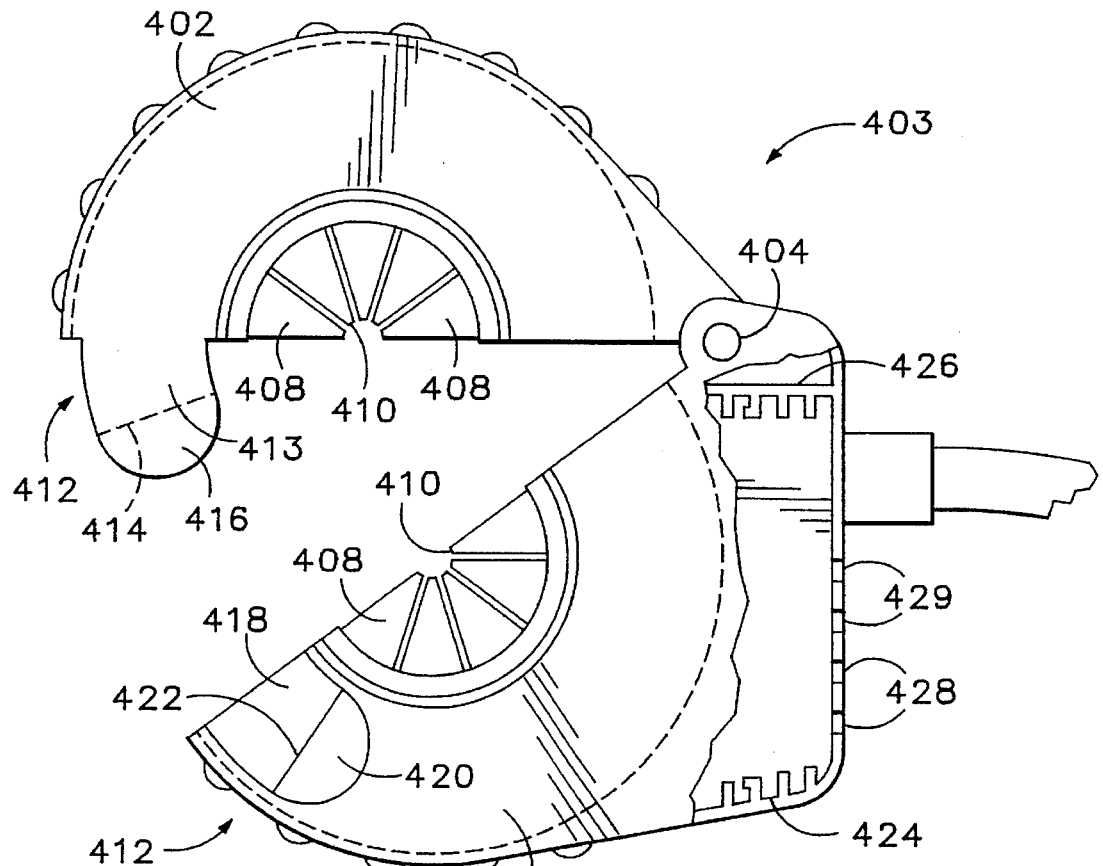
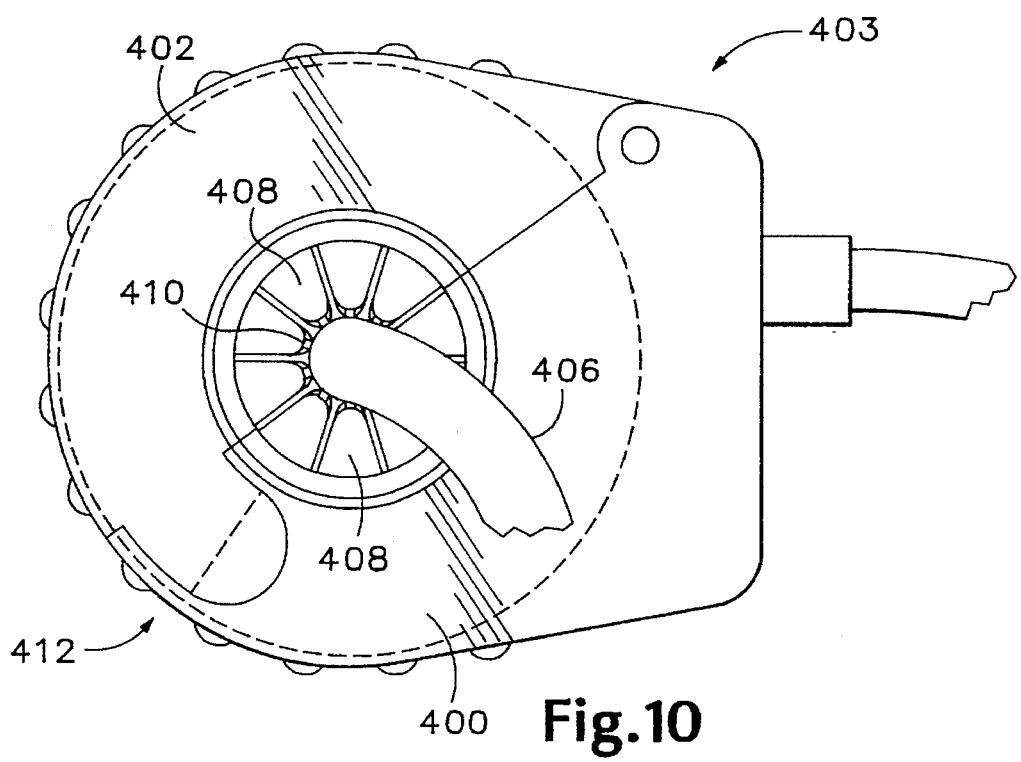

CURRENT SENSORS

BACKGROUND OF THE INVENTION

The present invention relates to a system for sensing voltage and current values within a power cable, and more particularly to a system for sensing electrical energy usage and accurately communicating information regarding such electrical energy usage to a remote location.

Many electrical devices currently exist for measuring the voltage, current and power carried by a power cable. Typically, a sensing transformer in the form of a toroidal coil of wire wrapped on a magnetically permeable core encircling the power cable is used to sense the electrical energy within the power cable. A split toroidal core is typically used because it can be easily affixed to an existing power cable without disconnecting the power cable. The wire of the coil is electrically connected to an electronic circuit which produces an output representative of one or more factors of the electrical power carried in the cable.

Bullock, U.S. Pat. No. 5,066,904 discloses a current sensor using a sensing coil having a toroidal core for measuring large magnitudes of AC current within a power cable. A shunt parallel with the power cable passes through the center of the toroidal core of the coil. Alternating load current in the shunt induces a voltage in the wire windings around the core, and the induced voltage is used as the input to an operational amplifier.

Miller, U.S. Pat. Nos. 4,413,230 and 4,491,790 disclose different electrical energy meters, each of which includes a transducer that produces output signal voltages, $e_i$ and $e_v$, respectively representative of the current and voltage components of the electrical energy in a power cable. The signal voltages are then used as input signals to a closely associated power measuring circuit. The measuring circuit of each of the Miller patents is in close proximity to the power cable and transducer, and as a result, attenuation of the signal voltages between the transducer and the measuring circuit is insignificant. However, if the same voltages were applied to a relatively long transmission line from the transducer to a remote measuring circuit, the signal voltages would be significantly attenuated, thereby significantly decreasing the accuracy of the measurements obtained.

Swarztrauber, et al., U.S. Pat. No. 4,783,748 discloses a system using a plurality of sensing units at remote locations for determining power within a plurality of power cables. A digital two-way communication system links the sensing units with a central processing unit that performs calculations on the signals produced by the remote sensing units. However, the use of a digital two-way communication system requires expensive circuitry to encode the signal to be produced by the remote sensing units and decode the signal received at the central processing unit.

Fernandes U.S. Pat. Nos. 4,794,327 and 4,855,671 disclose sensing power within multiple remotely located power cables and transmission of radio frequency signal representative of the power in each power cable to a central receiver for processing. Fernandes, however, requires expensive signal processing circuitry at both the transmitting and receiving locations, in addition to the further expense of transmitters and a receiver.

Current transformers with "air core" coils may be used in electrical measurement systems. An air core coil is a coil of wire wrapped on a core of material (e.g., plastic) that is not magnetically permeable. Air core coils provide a more linear response to substantial variations in load current levels and variable frequencies than can be obtained with coils wrapped on magnetically permeable cores, thereby permitting more accurate measurements of power carried in an electrical cable. However, air core coils inherently produce low induced voltages, as compared to coils wrapped on magnetically permeable cores. Low induced voltages require a metering circuit responsive to such low voltages to produce accurate results.

Howell, U.S. Pat. No. 4,297,741 discloses the use of air core current transformers to produce output voltages proportional to load currents in respective power cables. A full-wave rectifying network is connected to the current transformer secondaries to provide a rectified output voltage signal. A comparator issues a circuit breaker trip signal when the output voltage signal of the rectifying network achieves a preselected threshold voltage. Such a voltage signal, however, is susceptible to AC interference and to attenuation with transmission more than a few feet.

May, U.S. Pat. No. 5,003,278 discloses a pair of housing halves for a high frequency noise suppressor which can be snapped around a cable in clamshell fashion. A plurality of flexible fingers extend radially inward from the halves to engage a cable within a central opening. The fingers can bend outwardly to accept cables of various sizes. May, however, does not include structure within the housing for holding electronic circuitry.

What is still needed, then, is an inexpensive system for sensing power use and providing accurate signals indicative of power used in remotely-located power cables, over wide ranges of power and at various AC frequencies, and for conducting such signals to a remote location for interpretation and use of the information from the signals.

SUMMARY OF THE INVENTION

The present invention overcomes the aforementioned shortcomings of the prior measuring systems by providing a measuring system including a sensing transformer that produces a voltage signal in response to the presence of a changing current within a power cable. An input circuit is electrically connected to the transformer, to receive the voltage signal, and includes a circuit for producing an analog current signal representative of the changing current within the power cable in response to receiving the voltage signal produced by the sensing transformer. A transmission line has a first end electrically interconnected with the input circuit so as to receive the analog current signal and has a second end electrically interconnected with an output circuit located at a location remote from the first end. The output circuit receives the analog current signal from the transmission line and includes a circuit producing a resultant signal, such as an indication of current, voltage, or power usage in the power cable, in response to receiving the analog current signal. The information available in such a resultant signal can be used, for example, to make decisions to change the electrical load supplied by the power cable.

Converting the voltage signal of the sensing transformer to an analog current signal enables the transmission of an accurate signal representative of the current in the power cable over significant distances to an output circuit at a remote location. This eliminates the need for locating the output circuit proximate to the sensing transformer.

The present invention also overcomes the aforementioned shortcomings of the prior measuring systems by providing a method of measuring current in a power cable, by the steps of using a transformer to sense a changing current within a power cable and provide a voltage signal to an input circuit in response; then, in response to receiving the voltage signal, providing an analog current signal, representative of the changing current within the power cable, from the input circuit to a first end of a transmission line, communicating the analog current signal along the transmission line to a remote output circuit located at a second end of the transmission line, and there, in response to receiving the analog current signal, producing a resultant signal representative of the analog current signal.

In a preferred embodiment of the present invention, a plurality of sensing transformers and associated input circuits are provided, each input circuit being electrically interconnected with the output circuit through a respective transmission line. This permits the current within each of a plurality of remote power cables to be monitored at one central location.

In one embodiment of the invention, the input circuit includes a full-wave rectifier and the analog current signal is a full-wave rectified current signal, which is resistant to induced AC noise in the transmission line. To eliminate any AC noise induced in the transmission line, the analog current signal is integrated at the output circuit.

The foregoing and other objectives, features, and advantages of the invention will be more readily understood upon consideration of the following detailed description of the invention, taken in conjunction with the accompanying drawings.

BRIEF DESCRIPTION OF THE DRAWINGS

FIG. 9 is a top plan view of an opened housing for holding two halves of a toroidal coil of a sensing transformer around a power cable.

FIG. 10 is a top plan view of the housing shown in FIG. 9 in a closed position, holding two halves of a toroidal coil of a sensing transformer in place around a power cable.

DETAILED DESCRIPTION OF THE INVENTION

Figure 1:
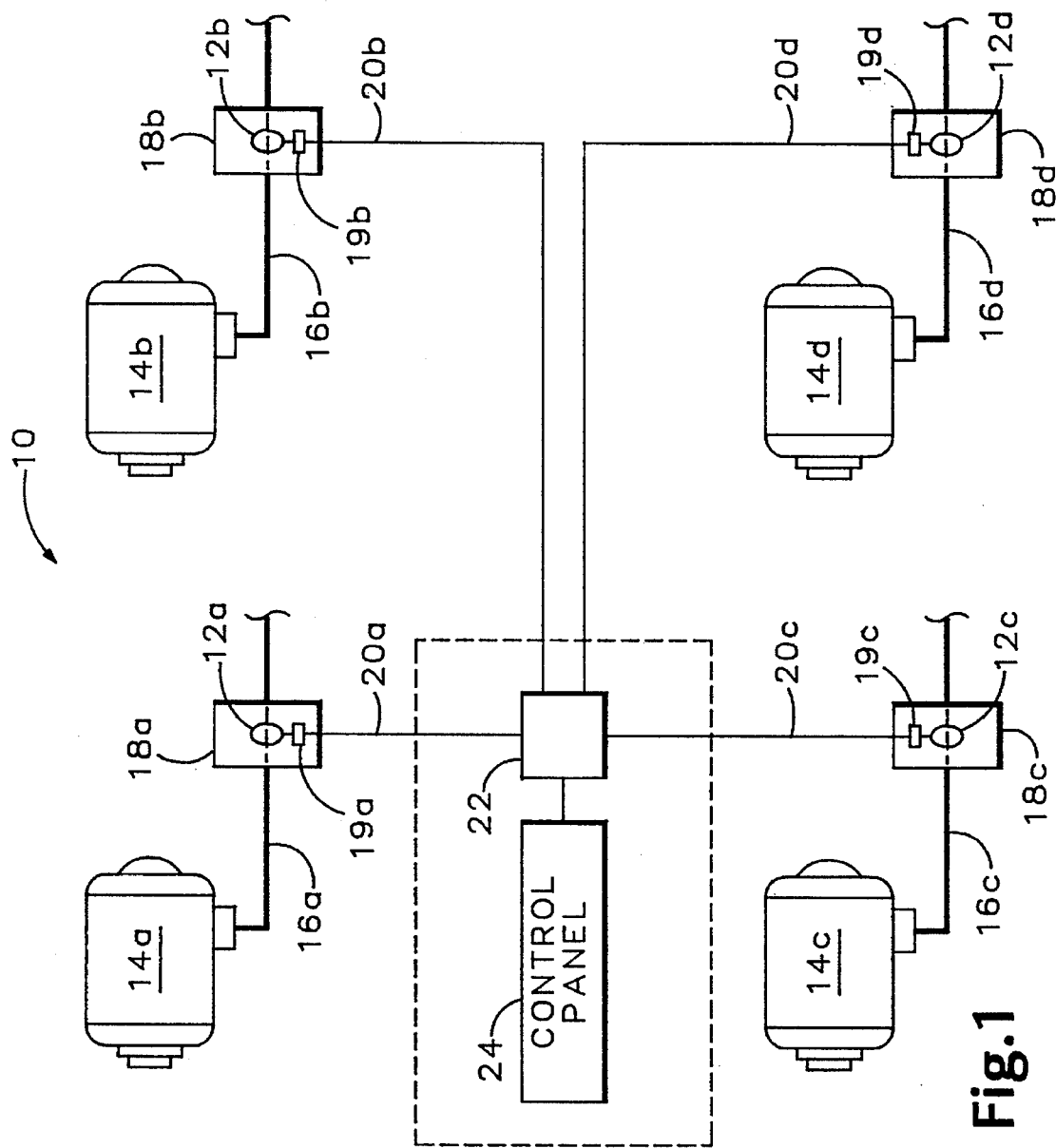
FIG. 1 is a simplified schematic representation of a current measuring system including multiple sensors and input circuits for communicating with a central remotely located output circuit embodying the present invention.

Referring to FIG. 1, a measuring system 10 is shown for measuring changing current within multiple power cables or lines 16a, 16b, 16c and 16d. Motors 14a, 4b, 14c, 14d or any other electrical devices which draw current through a power cable are located apart from each other and electrically interconnected with respective ones of the power cables 16a–16d. During operation of the motors 14a–14d it is desirable to monitor the current flowing in each of the power cables 16a–16d.

A respective sensor 18a, 18b, 18c, or 18d is located at each of the power cables 16a–16d to sense the current flowing in the respective cable. Each sensor 18a–18d includes a sensing transformer 12a, 12b, 12c, or 12d including a wire-wrapped magnetically permeable toroidal core typically made of iron, encircling the respective power cable 16a–16d. Thus, the wire wound on the core is the secondary winding, while the power cable 16a–16d, or a parallel shunt current divider, is the primary winding of the sensing transformer 12a–12d. Changing current in a power cable 16a–16d (i.e., alternating current) induces a changing electromagnetic field around the power cable 16a–16d, which in turn induces magnetic flux in the magnetically permeable core. The magnetic flux in the core induces in the wire windings on the toroidal core a voltage representative of the current in the power cable. An exemplary sensing transformer has the following construction: core material made by Arnold Engineering, of Norfolk, Nebr., of 0.012 silectron, 3% silicon steel, grain oriented, with an outside diameter of 1.375 inches, an inside diameter of 1.125 inches, strip width of 0.500 inches, strip thickness of 0.012 inches, an epoxy powder coating of 0.010 to 0.030 inches thick, a nylon overcoat wound on the metal core material, and a #35 AWG sized wire coated with a heavy polyurethane wound 1,800 turns as a secondary winding.

The ends of the secondary winding of each transformer 12a–12d are electrically connected to a respective input circuit 19a, 19b, 19c, 19d. Each input circuit 19a–19d is designed to convert the voltage signal received from the respective transformer 12a–12d to an analog current signal for transmission. The input circuit 19a–19d can be designed and constructed in any manner, so long as it converts the voltage signal output from the transformer to a corresponding analog current signal. Several exemplary input circuit designs for use with different transformers will be described later.

To measure the current in several power cables at locations remote from a central location, a respective transmission line 20a, 20b, 20c, or 20d is employed to electrically interconnect each input circuit 19a–19d to a single centrally located output circuit 22. When transmitting a signal over significant distances, such as distances of one hundred feet, or as far as thousands of feet, it is highly desirable to employ an analog current signal representative of the changing current within the power cable, because analog current signals are capable of transmission along transmission lines without significant attenuation. Without conversion to a current signal, the voltage signal from one of the transformers 12a–12d, applied directly to a transmission line, would be significantly attenuated within several feet, preventing the use of such a voltage signal as the basis of accurate measurement of the current within the power cable at any significant distance from the respective sensing transformer 12a–12d.

The output circuit 22 receives the analog current signal from each respective input circuit 19a–19d, scales the current signal to the desired range, integrates the signals over time if desirable, and delivers respective resultant signals to a control panel 24 in response to receiving the analog current signals. The control panel 24 in response to receiving the resultant signals from the output circuit 22 produces a display of information such as the power, overcurrent\overvoltage or undercurrent/undervoltage, time varying frequency, spikes, harmonics, etc., and may include control circuitry to change the status of electrical equipment supplied power through the power cable 16a–16d.

Using this measuring system 10 permits all of the adjustments for each of the remote sensors 18a, 18b, 18c, 18d to be made at the central location of the output circuit 22. The starter box at each motor 14a, 14b, etc. may remain closed after initial installation of the sensors 18a–18d. This eliminates the need to go back to electrically energized starter boxes to make trip-point adjustments, which reduces labor cost and increases safety, since one person can verify the status of the motors 14a–14d at the control panel 24, by using the control panel 24 to observe the current, voltage, or power flow of a particular motor 14a–14d.

Figure 2:
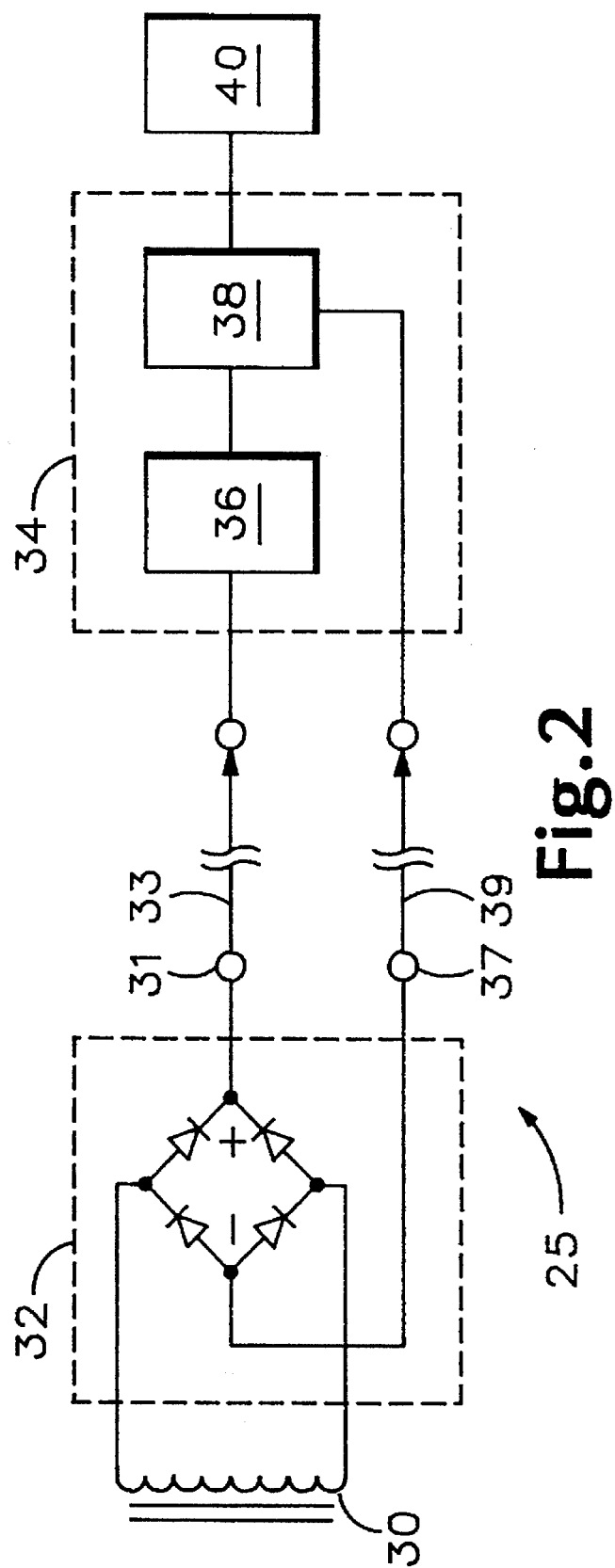
FIG. 2 is an electrical schematic diagram of an exemplary current measuring system embodying the invention, preferably to be used with a sensing transformer having a magnetically permeable core.

Referring to FIG. 2, a measuring system 25 includes a sensing transformer 30 having a magnetically permeable core. The transformer 30 produces a voltage signal, representative of the changing current within a power cable, and this voltage signal is applied to an input circuit 32. The input circuit 32 consists primarily of a four-diode bridge rectifying network to convert the voltage Signal to an analog full-wave rectified current signal, at terminal 31, representative of the voltage signal from the transformer 30. The importance of a full-wave rectified current signal is that during transmission along the transmission line 33, any induced AC noise that is superimposed on the transmitted signal is removable by using an integrator 36 to integrate the received signal in the output circuit 34. Frequently, the sensing transformer 30 is measuring current levels in a 60 Hz power cable, and the transmission line 33 is grouped with assorted other 60 Hz lines in a single conduit. This makes the presence of induced AC noise highly likely, and removal of induced AC noise increases the accuracy of the measurements. Such induced AC noise will be symmetrical with respect to a baseline and with integration over time the AC noise will be cancelled out. The ability to remove AC noise from the full-wave rectified analog current signal permits the transmission line 33 to be routed through areas, such as low voltage conduits that are not free of electromagnetic fields, and yet special shielding is not required for the transmission line 33 itself.

The input circuit 32 does not require a local power supply because the necessary current can be provided by a transmission line 39, or by connection of terminal 37 to ground. However, eliminating transmission line 39 may result in increased noise. The integrator 36 is connected to a scaling circuit 38 to scale the magnitude of the integrated signal and the scaling circuit 38 is in turn connected to the control panel 40.

A sensing transformer 30, with a core of magnetically permeable material, such as iron, generates a voltage signal reasonably accurately representative of the current in the power cables 16a–16d over a certain normal load range. However, iron and other magnetically permeable materials have hysteresis and other nonlinear responses to changing magnetic fields that result in a nonlinear relationship between current in the power cable and the voltage signal produced in a transformer coil having such a core. The nonlinearity of such responses is especially significant with large variations in load current and frequency.

To provide a more linear measurement of power, "air core" transformers have been designed using wire wrapped on a core made of material having a low magnetic permeability, such as one of plastic or nylon. Without a magnetically permeable core, the transformer winding generates relatively small voltage signals. An exemplary air core transformer has the following construction: core of nylon, outside diameter of 1.375 inches, inside diameter of 1.125 inches, strip width of 0.500 inches, and a #35 AWG sized wire coated with a heavy polyurethane, wound 4,000 turns as a secondary winding.

Figure 3:
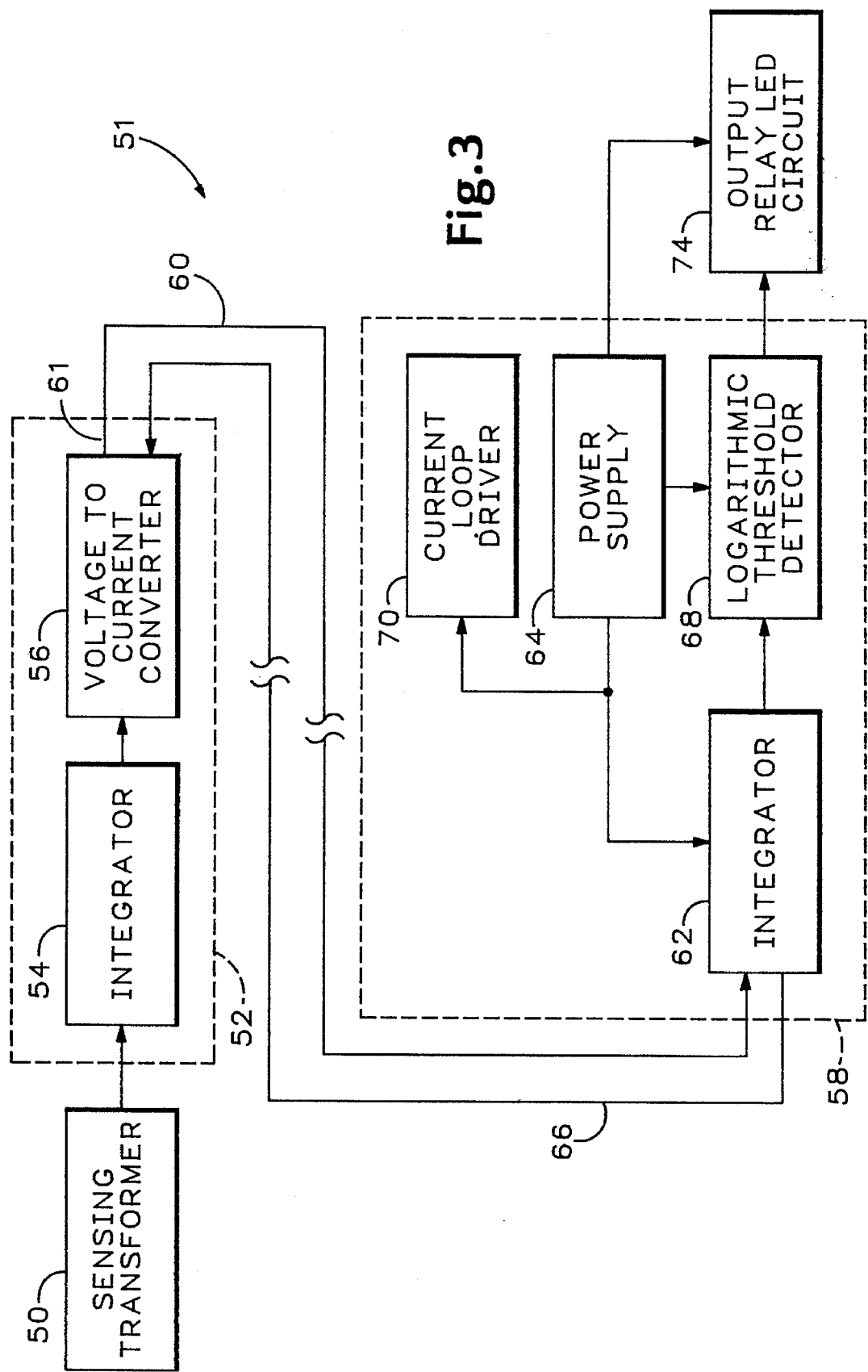
FIG. 3 is a block diagram of a current measuring system, preferably incorporating a sensing transformer having a core having a very low magnetic permeability.

An exemplary measuring system 51, shown in FIG. 3, is especially designed for use with a sensing transformer 50 having a core which has a very low magnetic permeability. Specific circuitry for each block shown in FIG. 3 will be described later. The secondary coil of the sensing transformer 50 is electrically connected to the input circuit 52. The input circuit 52 includes an integrator 54 to act as a low pass filter and for integrating the voltage signal from the transformer 50 to correct for a phase shift of ninety degrees between the current in the power cable and the voltage output from the transformer 50 because the transformer differentiates the current signal over time. Additionally, because of the very low permeability of the core, the voltage signal amplitude from the transformer 50 increases 6 db/octave with increased frequency. The integrator 54 is designed to counteract this frequency response by attenuating the voltage signal 6 db/octave. This results in a flattening of the voltage signal from the integrator 54 over a wide range of frequencies, which increases the accuracy of the analog current signal produced by the input circuit 52. The input circuit 52 will still function adequately with a transformer constructed with a magnetically permeable core; however, such transformers have a different frequency response and saturate at the high and low range of their operating frequencies.

The integrator 54 is connected to a voltage-to-current converter 56, which is preferably a class B "Push-Pull" circuit producing a full-wave rectified analog current signal available at terminal 61. The full-wave rectified analog current signal is transmitted through a transmission line 60 to the remote output circuit 58. The output circuit 58 includes an integrator 62 to integrate the full-wave rectified analog current signal to eliminate any induced AC noise from the current signal. The integrator 62 is powered by a power supply 64.

The integrator 62 is connected to a logarithmic threshold detector 68, which is also powered by the power supply 64 to permit scaling of the received signal to a useful range. Using a logarithmic scale for the detector 68 reduces the sensitivity of the adjustment of the detector 68, thereby facilitating manual adjustment to the useful range. The power supply 64 also drives a current loop driver 70 to supply current to a transmission line 66. Transmission lines 60 and 66 are preferably a twisted pair of wires. The detector 68 is connected to an output relay light emitting diode circuit 74 which is triggered when an overcurrent situation occurs. Other desirable circuits or devices could be substituted for or connected to the output relay light emitting diode circuit 74.

Figure 4:
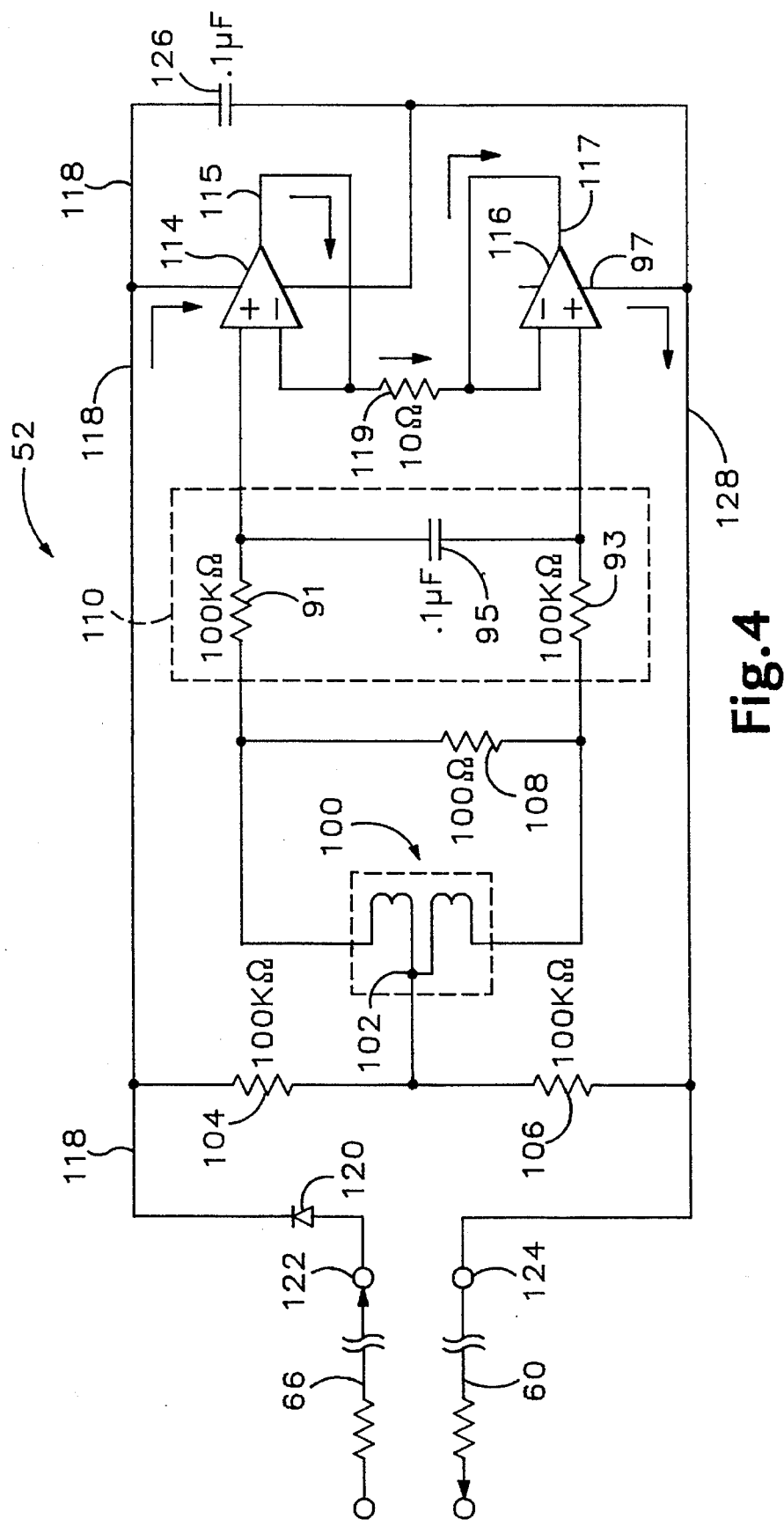
FIG. 4 is an electrical schematic diagram of an exemplary input circuit for a current measuring system, preferably for use with an air core sensing transformer coil.

FIG. 4 shows an exemplary input circuit 52, particularly useful with an air core sensing transformer 100. The transformer 100 includes a center tap 102 connected to a pair of biasing resistors 104 and 106. The center tap 102 and biasing resistors 104 and 106 add to the rejection of the common mode signals from the transformer 100 and reduce its susceptibility to noise. The transformer 100 is connected in parallel with a load resistance 108 having a magnitude selected to scale the voltage from the transformer 100 to a desired range.

An integrator 110 which consists of two resistors 91, 93 and a capacitor 95 is also connected in parallel with the transformer 100. The integrator 110 provides the input signal to the noninverting inputs of a pair of operational amplifiers 114 and 116. The operational amplifiers 114 and 116 are preferably Model LM358A manufactured by National Semiconductor Corporation. Each output terminal 115 or 117, respectively, of operational amplifiers 114 and 116 is connected to the inverting input of the respective operational amplifier 114 or 116. A resistor 119 is connected between the inverting inputs of the operational amplifiers 114 and 116.

To power the operational amplifiers 114 and 116, the current signal is supplied from the output circuit 58 through terminals 122 and 124 to a conductor 118. A forward biased diode 120 is connected in series with the conductor 118 to ensure the proper direction of current flow and protect the input circuit 52 from damage if terminals 122 and 124 are inadvertently connected improperly. A capacitor 126 is provided to reduce the feedback in the input circuit 52 to prevent the operational amplifiers 114 and 116 from oscillating.

As voltages are imposed on the noninverting inputs of the operational amplifiers 114 and 116, a current is drawn through the conductor 118. The majority of the current in the conductor 118 flows out of the output terminal 115 of the operational amplifier 114 and through the resistor 119. The current then flows into the output terminal 117 of the operational amplifier 116 and out of the operational amplifier 116 to a conductor 128. Other small currents also include current flowing into the inverting input of each operational amplifier 114 and 116, current flowing through the capacitor 126, and current flowing out of the lower output 97 of the operational amplifier 114.

The voltage imposed across the resistor 119 is the voltage across the capacitor 95 of the integrator 110, which is typically sinusoidal in nature because the power cable usually carries sinusoidal current. The current flowing through the resistor 119 follows the voltage imposed by the capacitor 95 of the integrator 110 at both noninverting operational amplifier inputs, producing a full-wave rectified analog current signal through the resistor 119. The full wave rectified analog current signal flows in a single direction to conductor 128 and to terminal 124. Terminal 124 is connected to the remote output circuit 58 through the transmission line 60. The input circuit 52 shown in FIG. 4 works well with low input voltage levels from the air core sensing transformer 100 because of the inclusion of the operational amplifiers 114 and 116.

Figure 5:
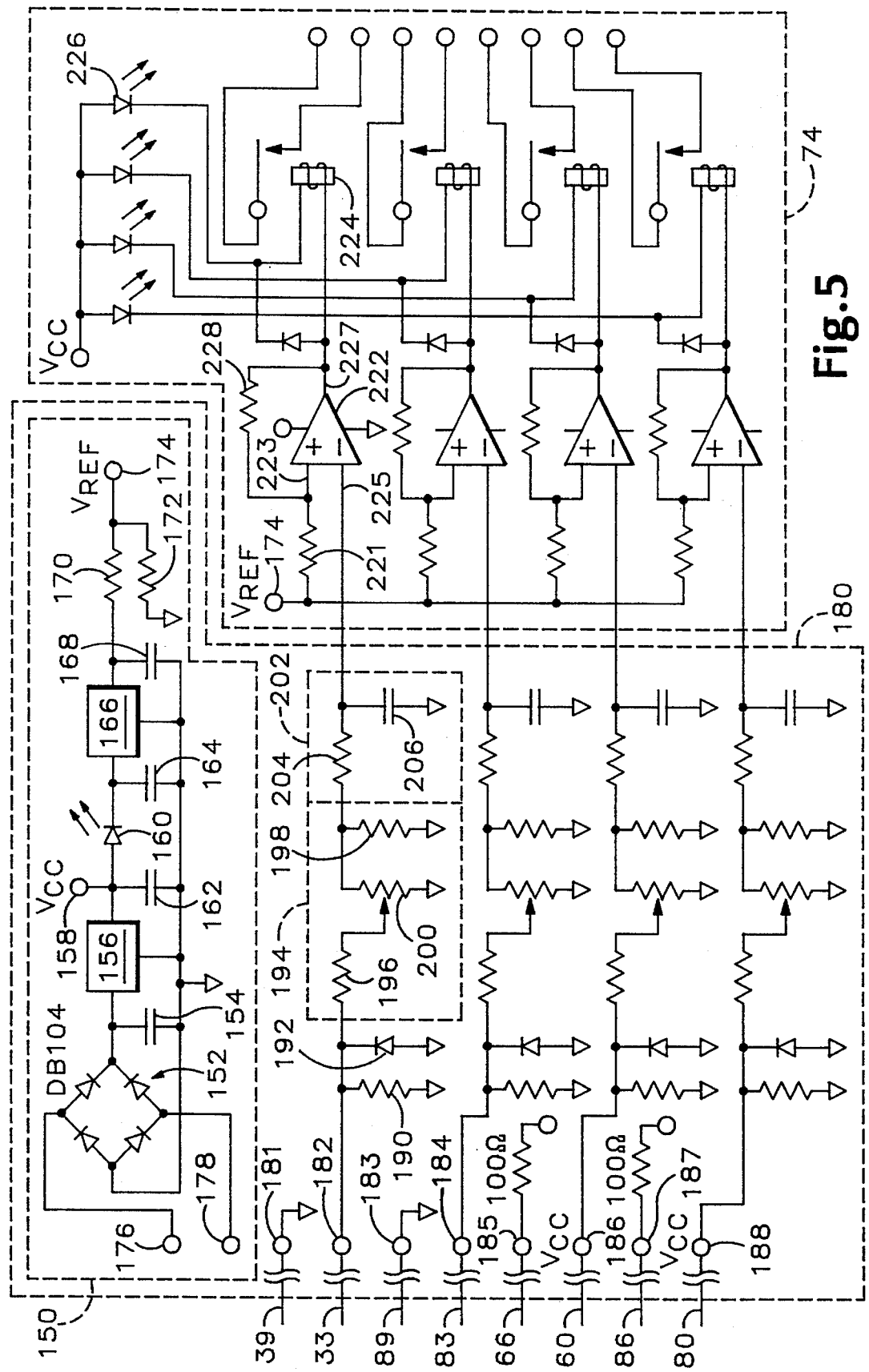
FIG. 5 is an electrical schematic diagram of an output circuit and control panel for a current measuring system embodying the present invention.

Referring to FIG. 5, an exemplary output circuit 180 is appropriate for use with the input circuit 52 shown in FIG. 4 or the input circuit 32 shown in FIG. 2. The output circuit 180 includes modules somewhat similar in design to the output circuit 58 shown in FIG. 3. A power supply 150 includes a pair of terminals 176 and 178 for receiving an external power input of, for example, 12 VAC. Connected to the terminals 176 and 178 is a four-diode bridge 152 connected to both a capacitor 154 and a voltage regulator 156, such as a LM7812 solid state voltage regulator manufactured by National Semiconductor Corporation, to provide a 12 volt DC output at VCC 158. VCC 158 is used to supply power to transmission lines 60 and 66 and the output relay light emitting diode circuit 74.

The voltage regulator 156 is also connected to a programmable voltage regulator 166, such as Model LM317L manufactured by National Semiconductor Corporation, through a pair of capacitors 162 and 164 and a light emitting diode 160. The output of the voltage regulator 166 is connected to a capacitor 168 and a pair of resistors 170 and 172 connected in series and having resistances of 150 ohms and 5 ohms, respectively. A reference voltage VREF equal to 40 millivolts is provided at terminal 174 to be used as a reference voltage in the output relay light emitting diode circuit 74. The reference voltage VREF at terminal 174 can be changed as desired to a different level by changing the values of the resistors 170 and 172.

An output circuit 180 includes four terminals 182, 184, 186, 188, each for receiving an analog current signal via a respective transmission line 33, 83, 60, 80, from a respective sensing transformer, such as one of the sensing transformers 12a–12d shown in FIG. 1. Specifically, referring to the circuit connected to the terminal 182, the received analog current signal is connected across terminals 181 and 182 and in connected in parallel with a load resistance 190, and a protection diode 192 for protecting the output circuit 180 against inadvertently reversed connections. A logarithmic threshold detector 194 consists of a resistor 196, a resistor 198, and on interposed potentiometer 200. A logarithmic scaling of the signal is accomplished by adjusting the potentiometer 200.

An integrating circuit 202, consisting of a resistor 204 connected in series and a parallel capacitor 206, is connected to the logarithmic threshold detector 194. The output of the integrator 202 provides to the output relay light emitting diode circuit 74 a voltage signal that is proportional to the current in the power line measured. Either pair of terminals; 181, 182; or 182, 183 may be used to receive analog current signals from the input circuit 32, shown in FIG. 2. Either pair of terminals; 185, 186; or 187, 188 may be used to receive analog current signals from the input circuit 52, shown in FIG. 4.

The output circuit 180 provides a resultant signal to the inverting input of a comparator 222. The noninverting input 223 of the comparator 222 is supplied the 40 millivolt reference signal VREF from terminal 174 through a resistor 221. The comparator 222 compares the two voltages at its input terminals 223 and 225 to produce an output signal at terminal 227 if the inverting input 225 is greater than the noninverting input 223, to activate a relay 224 which causes a light emitting diode 226 to illuminate, indicating an overcurrent situation. The resistor 228 creates a hysteresis effect from the comparator 222, thereby causing the relay 224 to trip at around 42 millivolts and turn off at around 39 millivolts, for example. Additionally, the comparator 222 provides enough power to drive the light emitting diode 226 and relay 224 directly. The preferred comparator is Model LM339A manufactured by National Semiconductor Corporation.

Figure 6:
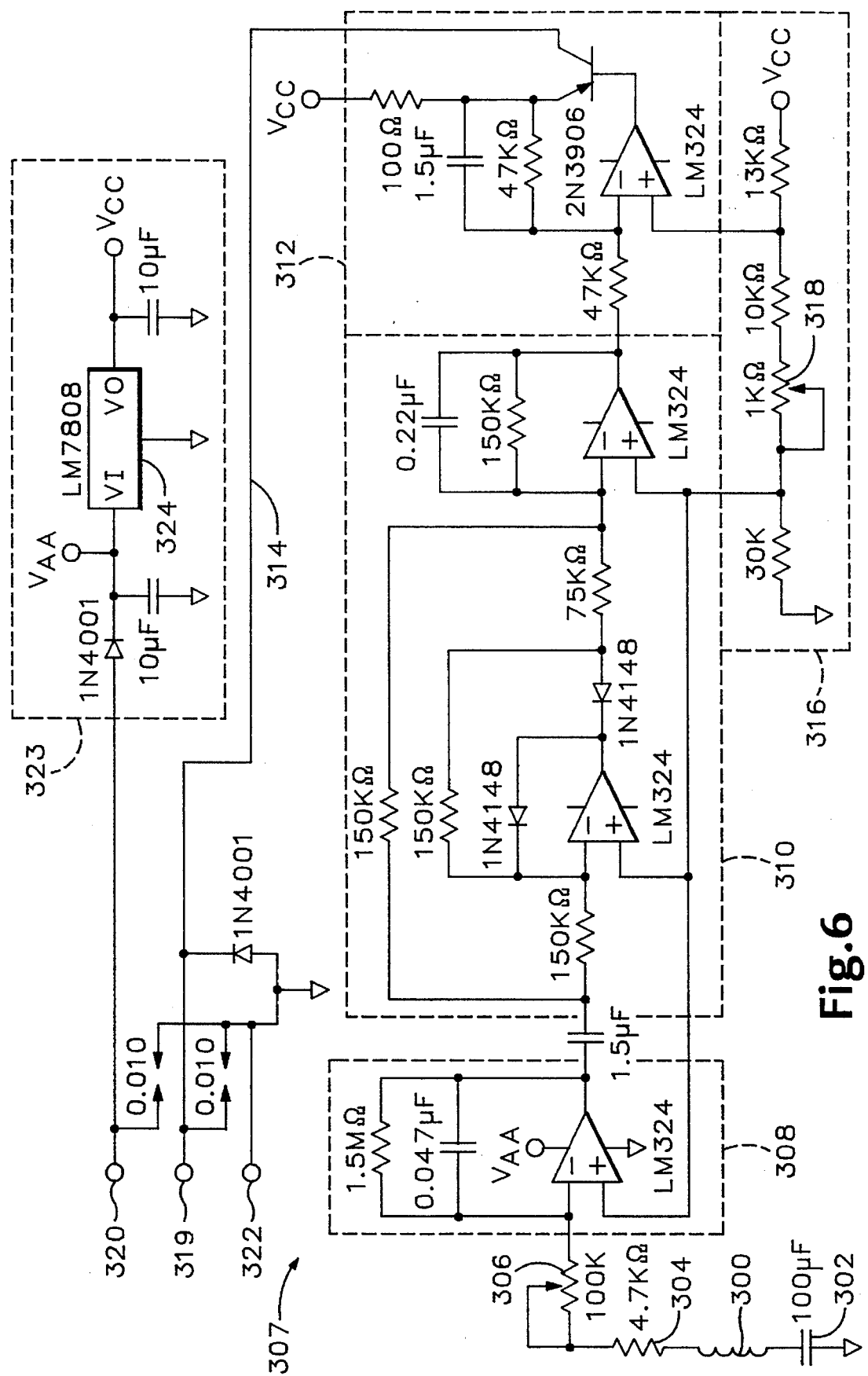
FIG. 6 is an electrical schematic diagram of a self-contained input circuit which is an alternative embodiment of the invention.

Referring to FIG. 6, a self-contained current measuring device 307 is shown. A sensing transformer coil 300, which preferably has an air core, though an iron core would also be acceptable, is connected to ground through a capacitor 302. A resistor 304 and a potentiometer 306 are connected in series with the sensing transformer 300 to allow the setting of overall gain of the device 307 to a selected value for the maximum anticipated current in a power cable.

A standard in the electrical power management industry is to use a 4–20 milliamp current source for supplying current to programmable logic controllers. The potentiometer 306 is therefore preferably set to provide a maximum output signal of 20 milliamps for the largest intended current in the power cable to be sensed by the sensing transformer 300. An integrator 308 is connected in series with the potentiometer 306 primarily to provide for a flattened response curve over a range of expected AC frequencies in the power cable. Integrator 306 is capacitively coupled to a high precision full-wave rectifier circuit 310. The rectifier 310 provides a full-wave rectified voltage signal to a voltage-to-current converter 312. The output of the converter 312 consists of a full-wave rectified analog current signal that is provided through a signal transmission line 314 to output signal terminal 319. A zero control circuit 316 includes a set of resistors including a potentiometer 318 to permit the setting of the current in the conductor 314 to a desired value, such as four milliamps, when the AC current is zero in the power cable being monitored. The overall circuit 307 of FIG. 6 thus provides a 4–20 milliamp full-wave rectified analog current signal to the output signal terminal 319. The terminal 322 receives current from any output circuit. Terminal 320 receives DC power for the circuit 307, preferably 12–30 volts from an outside power source for powering a regulator circuit 323 which includes a voltage regulator 324 to provide the source of VCC at eight volts DC.

TABLE 1

Exemplary Component Values for FIG. 5

| Reference No. | Description | Value |
|---|---|---|
| 154 | Capacitor | 22 μF/50 volts |
| 162 | Capacitor | 10 μF |
| 164 | Capacitor | 10 μF |
| 168 | Capacitor | 10 μF |
| 206 | Capacitor | 100 μF |
| 190 | Resistor | 2 watts/100 Ω |
| 196 | Resistor | 100 Ω |
| 198 | Resistor | ½ watt, 100 Ω |
| 204 | Resistor | 202 KΩ |
| 228 | Resistor | 2.2 MΩ |
| 221 | Resistor | 1 KΩ |
| 200 | Potentiometer | 100 KΩ |

Figure 7:
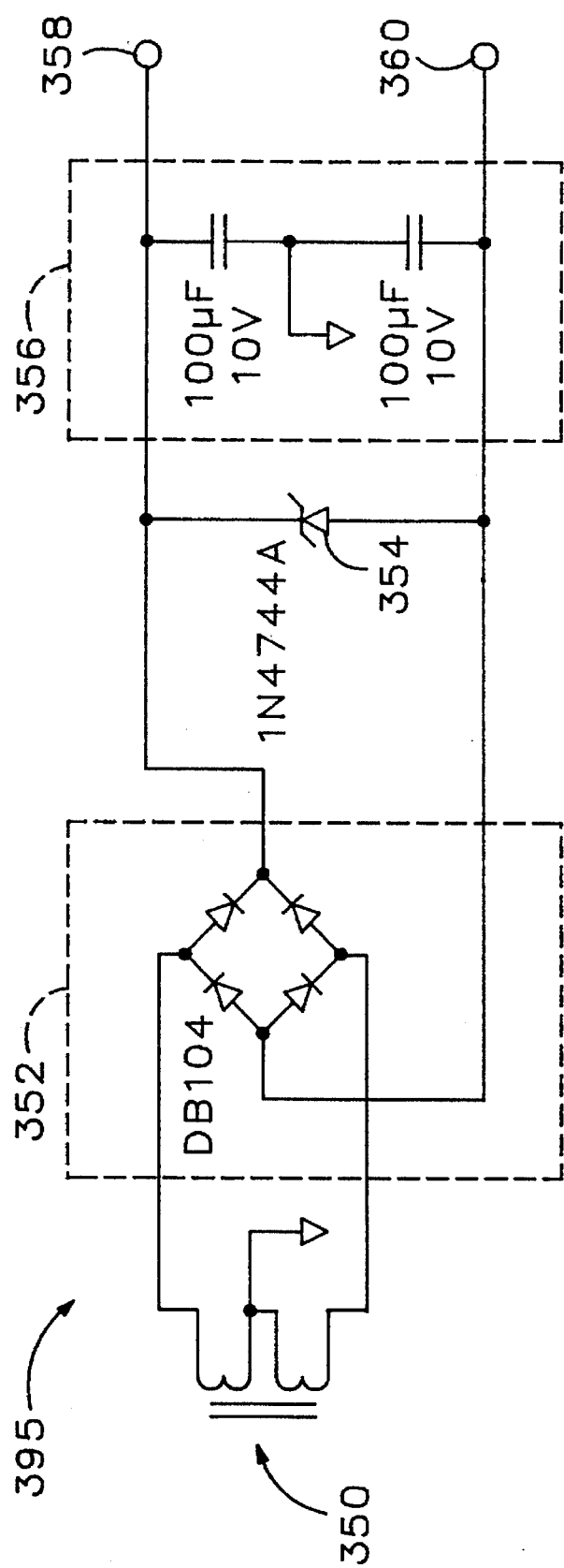
FIG. 7 is an electrical schematic diagram of a voltage supply which includes a sensing transformer having a magnetically permeable core.
Figure 8:
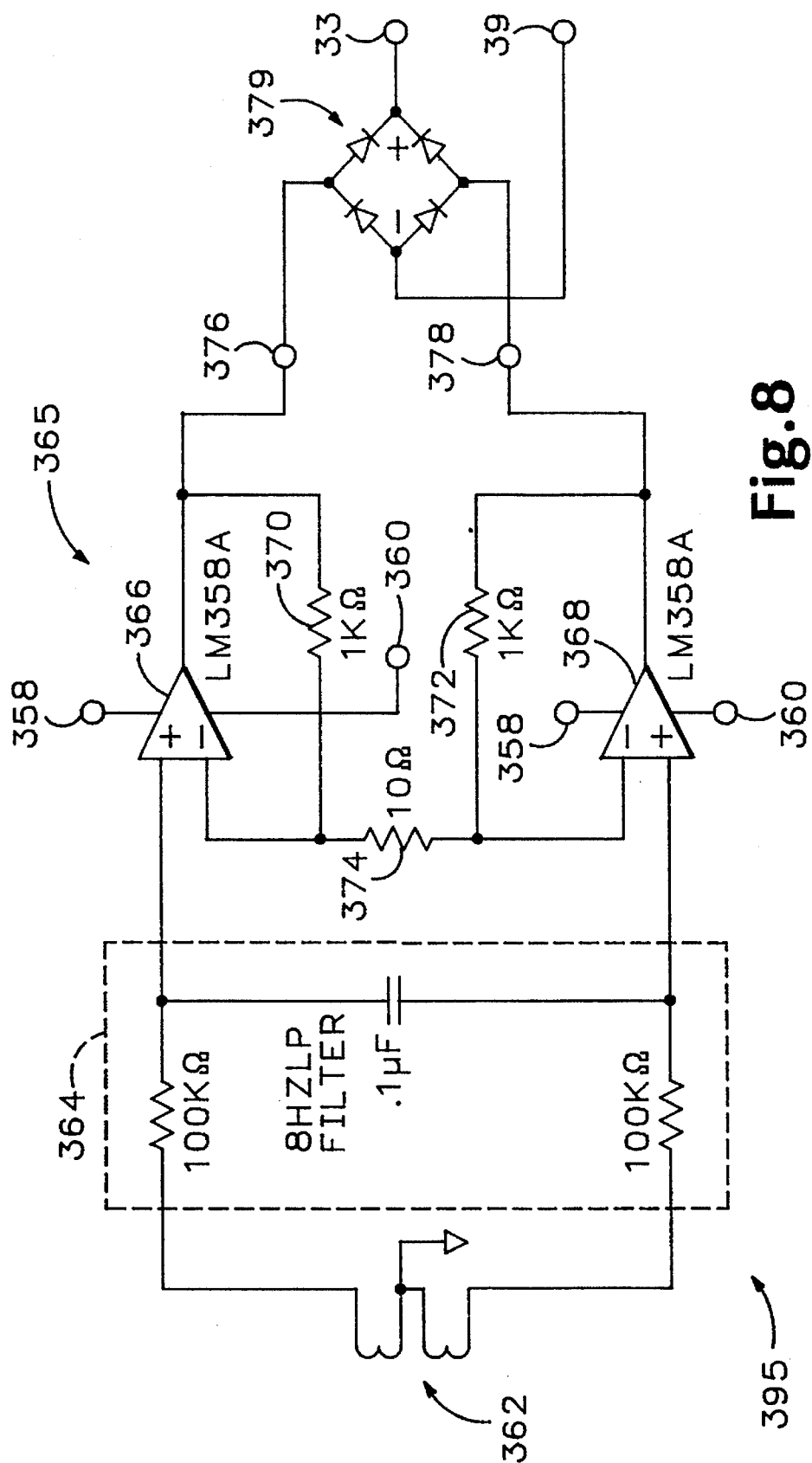
FIG. 8 is an electrical schematic diagram of a self-powered current measuring system.

A power sensing circuit 365 (actually two complementary circuits shown in FIGS. 7 and 8), of an alternative design incorporates an air core sensing transformer 362, yet uses the power cable 16 itself as a source of power for the circuit 395 to avoid having to have a separate power supply in the output circuit to provide the necessary power to drive the operational amplifiers for producing the analog current signal. An iron core parasitic transformer 350 is connected to a full-wave rectifier 352 to provide a full-wave rectified signal which is available between terminals 358 and 360. Connected in parallel with the rectifier 352 to protect against providing too much voltage to the operational amplifiers 366 and 368 is a 15-volt zener diode 354. A smoothing circuit 356 consisting of two grounded capacitors smooths the full-wave rectified signal to obtain a smoothed DC voltage signal at the terminals 358 and 360 to be provided to the operational amplifiers 366 and 368, as shown in FIG. 8.

An air core sensing transformer 362 has a grounded center tap to reject outside noise, as explained above with respect to transformer 100, and its secondary winding is connected to an integrator 364, which in turn is connected to the noninverting input terminals of a pair of operational amplifiers 366 and 368. The output signal from each operational amplifier 366 or 368 is connected through a respective resistor 370 or 372 to the inverting input terminal of the respective operational amplifier 366 or 368. A resistor 374 is connected between the inverting inputs of the operational amplifiers 366 and 368. The signal at terminals 376 and 378 has a voltage gain of a magnitude proportional to the ratio of resistors 370 to 374, and 372 to 374, respectively. The terminals 376 and 378 are connected to a full-wave rectifier circuit 379 to provide a full-wave rectified analog current signal to the transmission line 33.

A housing 403 for a split toroidal transformer core is shown in FIGS. 9 and 10 and comprises a pair of housing halves 400 and 402 interconnected by a hinge 404 located near the bottom side of the housing. A core half is positioned in each half of the housing 400 and 402, the halves together forming a toroidal core extending around a centrally located power cable 406 as shown in FIG. 10 when the housing 403 is in its closed, latched configuration. A plurality of triangular fingers 408 extend radially inward and have truncated apexes 410 to provide a central opening for the cable 406. If the cable 406 is larger than the opening defined between the apexes 410 of the fingers 408, then the fingers 408 will bend outwardly resiliently and thereby firmly engage the cable 406 elastically as shown in FIG. 10.

Oppositely disposed from the hinge 404 is a clamp 412 including an extending finger tab 413 with a circular end portion 416 with a ridge 414 having a greater thickness than the remainder of the tab 413. The tab 413 positively engages a matching recess 418 in housing half 400 which includes a deeper depression 420 demarcated by a ridge 422 able to engage with the ridge 414 for latchingly engaging the two halves 400 and 402 together. A tab 413 and a matching recess 418 are on each side of the housing 403.

A pair of matching circuit board slots 424 and 426 are provided in a lower portion of the coil holder. The individual slots provide a plurality of positions for the placement of a circuit board, such as one carrying the input circuit 52, shown in FIG. 4. Included in the bottom surface 428 of the housing 400 are a plurality of holes 429 to permit making adjustments to circuit components carried on the circuit board while it is contained within the housing 403, alleviating the need for opening the housing 403. By providing several different circuit board slots, a variety of circuit boards of different heights can be placed within the same housing 403 while making their components accessible through the holes 429.

Figure 11:
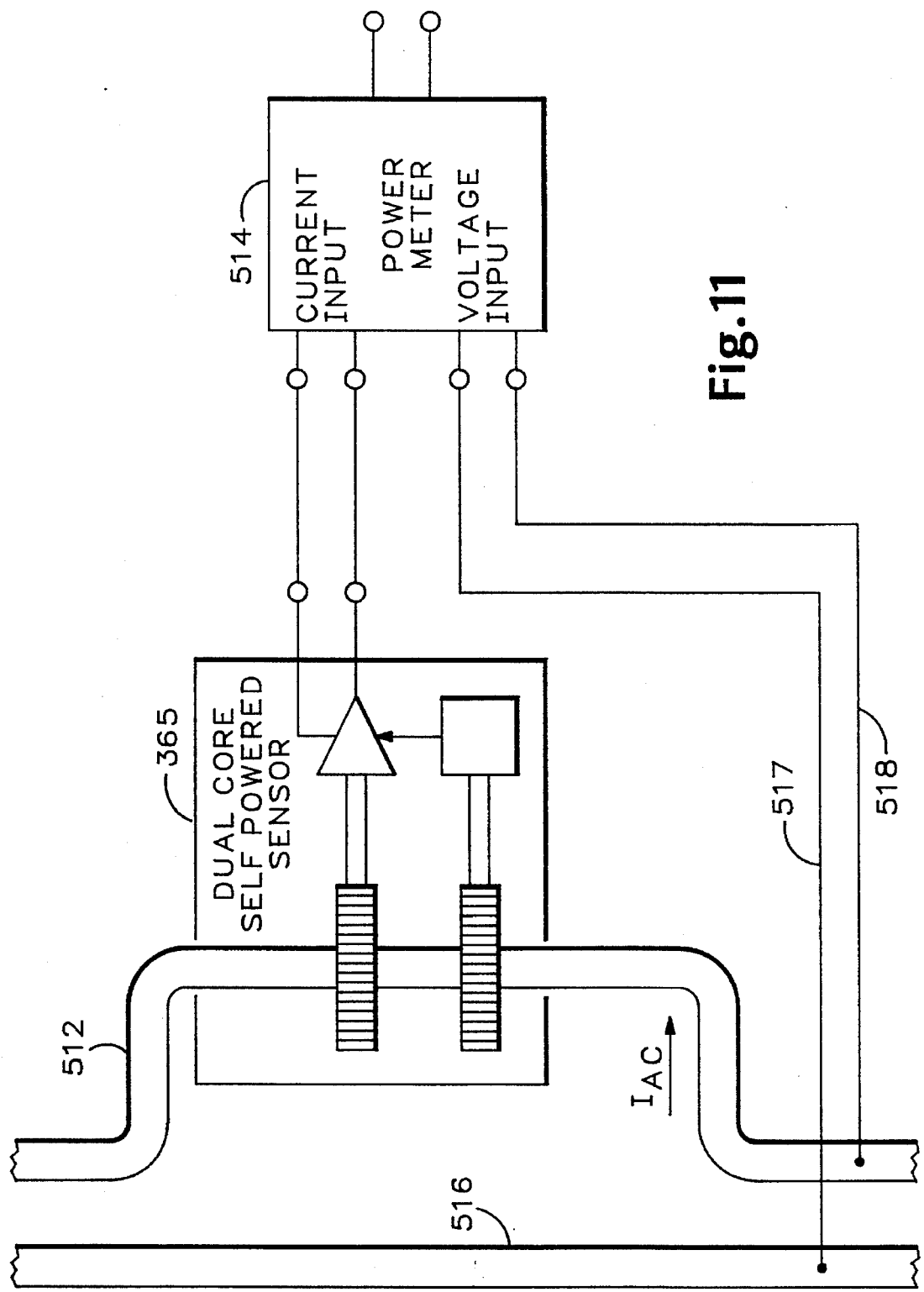
FIG. 11 is a block diagram of a current measuring circuit connected to a power meter.

Referring to FIG. 11, a power meter hookup is shown. A self-powering circuit 365, as disclosed in FIG. 7 and FIG. 8 combined, is coupled to a power cable 512 and provides a signal representing the current in the power cable 512 to a power meter 514. A pair of conductors 517 and 518 are connected to power cables 512 and 516 to supply a signal representing the voltage difference between power cables 512 and 516 to the power meter 514. The power meter 514 uses the voltage and current inputs to calculate power flow in the power cables.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

What is claimed is:

1. A measuring system comprising:

(a) a transformer magnetically linked with a power cable to produce a voltage signal in response to the presence of a changing current within the power cable;

(b) an input circuit electrically connected to said transformer for receiving said voltage signal and including means for producing a full-wave rectified analog current signal representative of said changing current within said power cable in response to receiving said voltage signal;

(c) a transmission line having a first end and a second end, said first end being electrically interconnected with said input circuit so as to receive said analog current signal; and (d) an output circuit spaced apart from said first end, said second end being electrically interconnected with said output circuit and said output circuit receiving said analog current signal therefrom, said output circuit including an integrator circuit for integrating said analog current signal and means for producing a resultant signal in response to receiving said analog current signal.

2. The system of claim 1, further comprising:

(a) a plurality of said transformers and a respective input circuit associated with each said transformer; and (b) a plurality of transmission lines each electrically interconnected between a respective one of said input circuits and said output circuit.

3. The system of claim 1, wherein said input circuit includes a diode bridge rectifier circuit.

4. The system of claim 1, wherein said transformer includes a wire wrapped toroidal core at least partially encircling said power cable.

5. The system of claim 1, wherein said output circuit includes a logarithmic threshold detector.

6. The system of claim 1, further comprising a control panel receiving said resultant signal and including means for producing an output in response to receiving said resultant signal.

7. The system of claim 4, wherein said toroidal core has a low magnetic permeability.

8. The system of claim 7, wherein said input circuit further comprises an integrator circuit that integrates said voltage signal from said transformer.

9. The system of claim 7, wherein said input circuit further comprises an integrator circuit electrically connected in parallel with said transformer and electrically connected to the noninverting inputs of a pair of operational amplifiers, and wherein said operational amplifiers produce a full-wave rectified current signal.

10. The system of claim 9 wherein said operational amplifiers are powered by a second toroidal transformer magnetically linked to a power cable to provide power to said operational amplifiers.

11. A method of measuring current comprising the steps of:

(a) providing a voltage signal from a transformer to an input circuit in response to sensing a changing current within a power cable;

(b) receiving said voltage signal in said input circuit;

(c) providing a full-wave rectified analog current signal representative of said changing current within said power cable from said input circuit to a first end of a transmission line;

(d) communicating said analog current signal through said transmission line to a remotely located output circuit located at a second end of said transmission line; and (e) receiving and integrating said analog current signal in said output circuit and producing a resultant signal from said output circuit in response to receiving and integrating said analog current signal.

12. A measuring system comprising:

(a) a transformer magnetically linked with a power cable to produce a voltage signal in response to the presence of a changing current within the power cable;

(b) an input circuit electrically connected to said transformer for receiving said voltage signal and including means for producing an analog current signal representative of said changing current within said power cable in response to receiving said voltage signal;

(c) a transmission line having a first end and a second end, said first end being electrically interconnected with said input circuit so as to receive said analog current signal; and (d) an output circuit spaced apart from said first end, said second end being electrically interconnected with said output circuit and receiving said analog current signal therefrom, said output circuit including a logarithmic threshold detector and means for producing a resultant signal in response to receiving said analog current signal.

13. A measuring system comprising:

(a) a transformer magnetically linked with a power cable to produce a voltage signal in response to the presence of a changing current within the power cable, said transformer including a wire wrapped toroidal core with a low magnetic permeability at least partially encircling said power cable;

(b) an input circuit electrically connected to said transformer for receiving said voltage signal and including means for producing an analog current signal representative of said changing current within said power cable in response to receiving said voltage signal;

(c) a transmission line having a first end and a second end, said first end being electrically interconnected with said input circuit so as to receive said analog current signal; and (d) an output circuit spaced apart from said first end, said second end being electrically interconnected with said output circuit and receiving said analog current signal therefrom, said output circuit including means for producing a resultant signal in response to receiving said analog current signal.

14. The system of claim 13, wherein said input circuit further comprises an integrator circuit that integrates said voltage signal from said transformer.

15. The system of claim 13, wherein said input circuit further comprises an integrator circuit electrically connected in parallel with said transformer and electrically connected to the noninverting inputs of a pair of operational amplifiers, and wherein said operational amplifiers produce a full-wave rectified current signal.

16. The system of claim 15 wherein said operational amplifiers are powered by a second toroidal transformer magnetically linked to a power cable to provide power to said operational amplifiers.

* * * * *